United States Patent
Hasegawa et al.

[11] Patent Number: 6,030,849
[45] Date of Patent: Feb. 29, 2000

[54] METHODS OF MANUFACTURING SEMICONDUCTOR, SEMICONDUCTOR DEVICE AND SEMICONDUCTOR SUBSTRATE

[75] Inventors: Yoshiaki Hasegawa; Akihiko Ishibashi; Nobuyuki Uemura; Yuzaburo Ban, all of Osaka; Masahiro Kume, Shiga; Yoshihiro Hara, Osaka; Isao Kidoguchi, Hyogo; Ayumu Tsujimura, Osaka, all of Japan

[73] Assignee: Matsushita Electric Industrial Co. Ltd., Osaka, Japan

[21] Appl. No.: 09/094,616

[22] Filed: Jun. 15, 1998

[30] Foreign Application Priority Data

Jun. 16, 1997 [JP] Japan .................................. 9-158365

[51] Int. Cl.[7] .................................................. H01L 21/20
[52] U.S. Cl. ........................... 438/46; 438/431; 438/503; 257/76; 257/79; 117/106; 117/952
[58] Field of Search .................................. 438/22, 39, 40, 438/41, 46, 47, 478, 479, 481, 503; 257/76, 79, 86, 94; 117/105, 106, 952

[56] References Cited

FOREIGN PATENT DOCUMENTS 06209122  7/1994  Japan .

OTHER PUBLICATIONS

E.J. Thrush et al., "Selective and non–planar epitaxy of InP, GaInAs and GaInAsP using low pressure MOCVD", Journal of Crystal Growth 124, pp. 249–254 (no month given), 1992.

E.J. Thrush, et al., "Selective and non–planar epitaxy of InP, GaInAs and GaInAsP using low pressure MOCVD", Journal of Crystal Growth 124, pp. 249–254, 1992.

J. Finders, et al., "Composition of selectively grown $In_xGa_{1-x}As$ structures from locally resolved Raman spectroscopy", Journal of Crystal Growth 107, pp. 151–155, 1991.

S. Keller, et al., "Growth and characterization of bulk InGaN films and quantum wells", Appl. Phys. Lett., vol. 68, pp. 3147–3149, May 27, 1996.

S. Nakamura, "High–Brightness InGaN Blue, Green and Yellow Light–Emitting Diodes with Quantum Well Structures", Jpn. J. Appl. Phys., vol. 34, Part 2, No. 7A, pp. L797–L799, Jul. 1, 1995.

A. Madhukar, "Growth of semiconductor heterostructures on patterned substrates: defect reduction and nanostructures", Proc. of Thin Solid Films, 231, pp. 8–42, 1993.

T. Tanaka, et al., "Selective growth of gallium nitride layers with a rectangular cross–sectional shape and stimulated emission from the optical waveguides observed by photo-pumping", Appl. Phys. Lett. 68 (7), pp. 976–978, Feb. 12, 1996.

*Primary Examiner*—Charles Bowers
*Assistant Examiner*—K Christianson
*Attorney, Agent, or Firm*—McDermott, Will & Emery

[57] ABSTRACT

On an entire surface of a substrate of sapphire having a projection with a width in the lateral direction of approximately 10 $\mu$m thereon, a first semiconductor layer of $Al_yGa_{1-y}N$ and a second semiconductor layer of $In_xGa_{1-x}N$ are successively grown by MOVPE. In this manner, an island-like stacked substance including the isolated first semiconductor layer and the isolated second semiconductor layer can be formed on the top surface of the projection of the substrate.

23 Claims, 10 Drawing Sheets

METHODS OF MANUFACTURING SEMICONDUCTOR, SEMICONDUCTOR DEVICE AND SEMICONDUCTOR SUBSTRATE

BACKGROUND OF THE INVENTION

The present invention relates to methods of manufacturing a group III–V compound semiconductor of AlInGaN for use in a light emitting device having a wavelength region from UV to orange-colored light, a semiconductor device using the group III–V compound semiconductor and a GaN semiconductor substrate.

Recently, there have been increasing demands for a light emitting diode for emitting visible light in a range between blue and red to be used as a light source for a multicolored display. In particular, various studies have been made on a group III–V compound semiconductor light emitting diode of gallium nitride (GaN) operated in a wavelength region from UV to orange-colored light. In this light emitting diode, an active layer is generally formed out of indium gallium nitride (InGaN), and the most significant point in realizing this light emitting diode is attaining improvement of the quality of the crystal by decreasing defects in the InGaN layer.

Now, a conventional method of growing a semiconductor of InGaN will be described.

The conventional method of growing a semiconductor of InGaN is described in, for example, Japanese Laid-Open Patent Publication No. 6-209122. This publication describes that it is significant to control both a growth temperature and a growth rate in order to obtain InGaN having high quality and good crystallinity at high reproducibility, and that nitrogen is preferably used as a carrier gas for a material gas.

Also, as first paper relating to composition control of In in InGaN crystal, "Applied Physics Letters, Vol. 68 (1996) pp. 3147–3149" will be given. According to this paper, it is effective to decrease the growth temperature and increase the growth rate in order to increase the composition ratio of In in InGaN.

Furthermore, as second paper examining comparison of plural GaN light emitting diodes provided with InGaN active layers respectively including different composition ratios of In, "Japanese Journal of Applied Physics, Vol. 34 (1995) pp. L797–L799" will be given. According to this paper, when the composition ratio x of In in the active layer of $In_xGa_{1-x}N$ (wherein $0<x<1$) is gradually increased, for example, so that a blue light emitting diode in which the composition ratio x of In is 0.2 and a yellow light emitting diode in which the composition ratio x of In is 0.7 can be compared with each other, the yellow light emitting diode is inferior to the blue light emitting diode in the luminance efficiency, the color purity and the luminance.

This is for the following reason: As the composition ratio of In in the active layer is increased, a difference in the lattice constant and the thermal expansion coefficient between the active layer and a barrier layer of, for example, AlGaN disposed in the vicinity of the active layer is increased, resulting in causing excessive strain in the active layer. As a result, when this strain is increased to have a value exceeding a critical value, a defect such as misfit dislocation is introduced into the active layer so as to relax the strain, and hence, the luminance of the light emitting diode is degraded.

In this manner, although the above-described publication and the first paper describe the method of controlling the composition ratio of In in a semiconductor of InGaN, they do not mention the quality improvement of InGaN crystal when the composition ratio of In is large as in a yellow or orange-colored light emitting diode. Therefore, there arises a first problem that InGaN crystal having high quality and including less defects cannot be obtained when the composition ratio of In is large. According to an opinion described in the second paper, it is difficult to obtain InGaN crystal including a large composition ratio of In and having good crystallinity merely by controlling the growth temperature and the growth rate.

Also, in the case where a GaN semiconductor is doped to achieve a p-conductivity, and for example, a resistance is required to be decreased as in a p-type contact layer, when magnesium (Mg) used as a p-type dopant is excessively supplied in the growth of the semiconductor, there arises a second problem that the resistance of the p-type contact layer is increased in contrast or the p-type contact layer is changed to have an n-type conductivity.

Furthermore, since a good quality GaN substrate is not available for use in a GaN semiconductor, sapphire ($Al_2O_3$) is occasionally used as a substrate. Sapphire has an insulating property. In the case where a conductive substrate is used, for example, in manufacturing a light emitting diode, it is easy to form one electrode on a device forming area and the other electrode on the other surface of the device forming area. In the case where sapphire is used, however, it is necessary to form one electrode on a device forming area and to remove a part of the device forming area to form the other electrode. In this manner, there arises a third problem that the manufacturing process is complicated.

SUMMARY OF THE INVENTION

A first object of the invention is obtaining InGaN crystal which can retain good crystallinity even when the composition ratio of In is large, a second object is definitely controlling a p-type dopant in a GaN semiconductor achieving a p-conductivity, and a third object is easily forming electrodes of a semiconductor device including a GaN semiconductor.

The first method of manufacturing a semiconductor of this invention, for achieving the first object, comprises the steps of growing a first semiconductor layer of a group III nitride on an entire surface of a substrate having a projection thereon; and growing a second semiconductor layer of $In_xGa_{1-x}N$, wherein $0 \leq x \leq 1$, on an entire surface of the first semiconductor layer, whereby an island-like stacked substance including the first semiconductor layer and the second semiconductor layer is formed on a top surface of the projection of the substrate.

In the first method of manufacturing a semiconductor, the second semiconductor layer of InGaN is grown on the top surface of the projection provided on the substrate. Therefore, the second semiconductor layer is formed in the shape of an island having a base in substantially the same shape as that of the top surface. Accordingly, when the dimension in the lateral direction of the projection is smaller than 50 μm, a stress derived from incorporation of In atoms into the second semiconductor layer, for example, a stress derived from a difference in the lattice constant and the thermal expansion coefficient, is applied to the second semiconductor layer merely in a uniaxial direction. Therefore, strain in the crystal can be largely reduced, so as to suppress occurrence of defects such as dislocation accompanied with the strain. Thus, the crystallinity of InGaN can be improved. Also, among In atoms supplied onto the substrate, those not grown on the side surface of the projection are diffused onto the top surface of the projection, resulting in increasing the composition ratio of In in the second semiconductor layer grown thereon.

The second method of manufacturing a semiconductor of this invention, for achieving the first object, comprises the steps of growing, on a substrate, a first semiconductor layer of a group III nitride having a projection thereon; and growing a second semiconductor layer of $In_xGa_{1-x}N$, wherein $0 \leq x \leq 1$, on an entire surface of the first semiconductor layer, whereby an island-like stacked substance including the first semiconductor layer and the second semiconductor layer is formed on a top surface of the projection of the first semiconductor layer.

In the second method of manufacturing a semiconductor, the second semiconductor layer of InGaN is grown on the top surface of the projection provided on the first semiconductor layer. Accordingly, similarly to the first method of manufacturing a semiconductor, the stress derived from the incorporation of In atoms into the second semiconductor layer is applied in the uniaxial direction alone. Therefore, the strain of the crystal can be largely reduced, so as to suppress the occurrence of defects such as dislocation accompanied with the strain. Thus, the crystallinity of InGaN can be improved. Also, among In atoms supplied onto the substrate, those not grown on the side surface of the projection are diffused onto the top surface of the projection, resulting in increasing the composition ratio of In in the second semiconductor layer grown thereon.

The third method of manufacturing a semiconductor of this invention, for achieving the first object, comprises the steps of forming, on a substrate, a mask pattern for selective growth having an opening; growing a first semiconductor layer of a group III nitride on the opening of the mask pattern on the substrate; and growing a second semiconductor layer of $In_xGa_{1-x}N$, wherein $0 \leq x \leq 1$, on the first semiconductor layer, whereby a stacked substance including the first semiconductor layer and the second semiconductor layer is selectively formed on the opening of the mask pattern on the substrate.

In the third method of manufacturing a semiconductor, the first semiconductor layer of the group III nitride is selectively grown on the opening of the mask pattern, so that the first semiconductor layer can be formed into a shape of a projection on the substrate. Thereafter, the second semiconductor layer of InGaN is selectively grown on the top surface of the first semiconductor layer in the shape of the projection. Accordingly, similarly to the first method of manufacturing a semiconductor, the stress derived from the incorporation of In atoms into the second semiconductor layer is applied in the uniaxial direction alone. Therefore, the strain of the crystal can be largely reduced, so as to suppress occurrence of a defect such as dislocation accompanied with the strain. Thus, the crystallinity of InGaN can be improved. Furthermore, the composition ratio of In in the second semiconductor layer grown on the top surface of the projection can be increased.

In the third method of manufacturing a semiconductor, the mask pattern is preferably formed out of silicon oxide or silicon nitride. In this manner, the mask pattern can be easily formed and can be easily and definitely removed through wet etching.

In any of the first through third methods of manufacturing a semiconductor, the stacked substance preferably has a rectangular or trapezoidal section taken in a direction vertical to a surface of the substrate. In this manner, In atoms can be easily diffused onto a small area on the top surface of the projection during the crystal growth, and hence, the composition ratio of In in the second semiconductor layer can be increased without degrading the crystallinity. Accordingly, when the second semiconductor layer is used as an active layer, a light emitting diode for emitting visible light with a long wavelength, for example, orange-colored light can be realized.

The fourth method of manufacturing a semiconductor of this invention, for achieving the second object, comprises a step of growing a group III nitride on an entire surface of a substrate having a projection thereon with a p-type dopant supplied, whereby an island-like p-type semiconductor layer of the group III nitride is grown on a top surface of the projection of the substrate.

In the fourth method of manufacturing a semiconductor, the group III nitride is grown on the top surface of the projection provided on the substrate. Therefore, when the dimension in the lateral direction of the projection is smaller than 50 $\mu$m, a part of the p-type dopant supplied onto the substrate not incorporated into the side surface of the projection is diffused onto the top surface of the projection. Thus, the concentration of the p-type dopant in the p-type semiconductor layer grown in the shape of an island on the top surface of the projection can be increased without excessively supplying the p-type dopant. As a result, the resistance of the p-type semiconductor layer can be easily and definitely decreased.

The fifth method of manufacturing a semiconductor of this invention, for achieving the second object, comprises the steps of forming, on a substrate, a semiconductor layer of a group III nitride having a projection thereon; and growing a group III nitride on an entire surface of the semiconductor layer with a p-type dopant supplied, whereby an island-like p-type semiconductor layer of the group III nitride is grown on a top surface of the projection of the semiconductor layer.

In the fifth method of manufacturing a semiconductor, the group III nitride is selectively grown on the top surface of the projection provided on the first semiconductor layer. Accordingly, similarly to the fourth method, a part of the p-type dopant not incorporated into the side surface of the projection is diffused onto the top surface of the projection, resulting in increasing the concentration of the p-type dopant in the p-type semiconductor layer grown in the shape of an island on the top surface of the projection. Thus, the resistance of the p-type semiconductor layer can be easily and definitely decreased.

The sixth method of manufacturing a semiconductor of this invention, for achieving the second object, comprises the steps of forming, on a substrate, a mask pattern for selective growth having an opening; and selectively growing a group III nitride on the opening of the mask pattern on the substrate with a p-type dopant supplied, whereby a p-type semiconductor layer of the group III nitride is selectively grown on the opening of the mask pattern on the substrate.

In the sixth method of manufacturing a semiconductor, the group III nitride is selectively grown on the opening of the mask pattern, thereby forming the p-type semiconductor layer into the shape of a projection on the substrate. Accordingly, similarly to the fourth method, a part of the p-type dopant not incorporated into the side surface of the p-type semiconductor layer is diffused onto the top surface of the p-type semiconductor layer in the shape of the projection. As a result, the concentration of the p-type dopant in the p-type semiconductor layer grown on the top surface can be increased.

In the sixth method of manufacturing a semiconductor, the mask pattern is preferably formed out of silicon oxide or silicon nitride. In this manner, the mask pattern can be easily formed, and can be easily and definitely removed through wet etching.

In any of the fourth through sixth methods of manufacturing a semiconductor, the p-type semiconductor layer preferably has a rectangular or trapezoidal section taken in a direction vertical to a surface of the substrate. In this manner, the p-type dopant can be easily diffused in a small area on the top surface of the projection during the growth of the crystal, resulting in further increasing the concentration of the p-type dopant.

The first method of manufacturing a semiconductor device of this invention, for achieving the first object, comprises the steps of growing, on a substrate having a projection thereon, a cladding layer of a first conductivity type on a top surface of the projection of the substrate; growing an active layer of $In_xGa_{1-x}N$, wherein $0 \leq x \leq 1$, on the cladding layer of the first conductivity type; and growing a cladding layer of a second conductivity type on the active layer.

In the first method of manufacturing a semiconductor device, the active layer of InGaN is formed by the first method of manufacturing a semiconductor of this invention, and hence, the composition ratio of In can be increased without degrading the quality of crystal of the active layer. Furthermore, since the active layer is formed in a defined area, namely, the top surface of the projection of the substrate, an operation current can be largely decreased due to the effect of a decreased volume of the active layer. Therefore, the semiconductor device can be suppressed from emitting heat, resulting in largely improving the reliability thereof.

The second method of manufacturing a semiconductor device of this invention comprises the steps of forming, on a substrate, a semiconductor layer of a group III nitride having a projection thereon; growing a first cladding layer of a first conductivity type on a top surface of the projection of the semiconductor layer; growing an active layer of $In_xGa_{1-x}N$, wherein $0 \leq x \leq 1$, on the cladding layer of the first conductivity type; and growing a cladding layer of a second conductivity type on the active layer.

In the second method of manufacturing a semiconductor device, the active layer of InGaN is formed by the second method of manufacturing a semiconductor of this invention. Therefore, the composition ratio of In can be increased without degrading the quality of crystal of the active layer. Furthermore, since the active layer is formed in a defined area, namely, the top surface of the projection on the substrate, the operation current can be largely decreased due to the effect of the decreased volume of the active layer.

The third method of manufacturing a semiconductor device of this invention, for achieving the first and third objects, comprises the steps of growing a contact layer of a first conductivity type on a substrate; forming a mask pattern for selective growth having an opening on the contact layer of the first conductivity type; selectively growing a cladding layer of the first conductivity type on the opening of the mask pattern on the contact layer of the first conductivity type; selectively growing an active layer of $In_xGa_{1-x}N$, wherein $0 \leq x \leq 1$, on the cladding layer of the first conductivity type; and selectively growing a cladding layer of a second conductivity type on the active layer.

In the third method of manufacturing a semiconductor device, the active layer of InGaN is formed by the third method of manufacturing a semiconductor of this invention. Accordingly, the composition ratio of In can be increased without degrading the quality of crystal of the active layer. Furthermore, since the active layer is formed in a defined area, namely, the top surface of the projection on the substrate, the operation current can be largely decreased due to the effect of the decreased volume of the active layer, resulting in suppressing the semiconductor device from emitting heat. As a result, the reliability of the semiconductor device can be largely improved.

The third method of manufacturing a semiconductor device preferably further comprises a step of baring the contact layer of the first conductivity type by removing the mask pattern through wet etching. In this manner, even when a substrate does not have a conducting property, the contact layer of the first conductivity type can be easily formed by using, as the mask pattern, a material on which a GaN semiconductor cannot be grown, such as a silicon nitride film. Therefore, the process for forming the electrode can be eased, resulting in decreasing the manufacturing cost and improving the yield.

In any of the first through third methods of manufacturing a semiconductor device, the second conductivity type is preferably a p-type conductivity, and the method is preferably further provided with a step of growing a group III nitride on the cladding layer of the second conductivity type with a p-type dopant supplied, whereby a p-type contact layer of the group III nitride is formed. In this manner, the second object can be achieved, and the resistance of the p-type contact layer can be definitely decreased. Therefore, the semiconductor device can be operated at a low voltage and can be suppressed from emitting heat, resulting in improving the reliability of the semiconductor device.

The first method of manufacturing a semiconductor substrate of this invention comprises the steps of forming a mask pattern for selective growth having an opening on a first substrate; and growing a semiconductor layer including gallium and nitrogen on and in a periphery of the opening of the mask pattern on the first substrate, whereby a second substrate including the semiconductor layer is formed on the first substrate.

In the first method of manufacturing a semiconductor substrate, the semiconductor layer grown in the periphery of the opening of the mask pattern is scarcely affected by dislocation and the like extending from the substrate in a direction vertical to the substrate, as compared with the semiconductor layer grown on the opening. Therefore, the quality of the crystal in the periphery is very high. Accordingly, when the mask pattern and the first substrate are removed, a GaN semiconductor substrate with high quality can be obtained.

The second method of manufacturing a semiconductor substrate of this invention comprises the steps of growing a first semiconductor layer including gallium and nitrogen on an entire surface of a first substrate; forming a mask pattern for selective growth having an opening on the first semiconductor layer; and growing a second semiconductor layer including gallium and nitrogen on and in a periphery of the opening of the mask pattern on the first semiconductor layer, whereby a second substrate including the second semiconductor layer is formed on the first substrate.

In the second method of manufacturing a semiconductor substrate, after growing the first semiconductor layer of GaN on the first substrate, the mask pattern for the selective growth is formed on the first semiconductor layer. Therefore, the quality of the second substrate including the GaN semiconductor layer can be further improved as compared with that obtained by the first method of manufacturing a semiconductor substrate.

DETAILED DESCRIPTION OF THE INVENTION

Embodiment 1

Third paper, "Thin Solid Films, Vol. 231 (1993) pp. 8–42" describes the following: In a group III–V compound semiconductor of indium gallium arsenide (InGaAs) used in a light emitting diode with a long wavelength, an area where InGaAs crystal can be grown is defined on a substrate of GaAs, and the InGaAs crystal is selectively grown in the defined area. Thus, an InGaAs film having strain can be grown with good crystallinity into a thickness exceeding a critical thickness where dislocation is caused in the InGaAs film.

In view of this description, in a first embodiment of the invention, in GaN semiconductor crystal mainly used in a light emitting diode with a short wavelength, InGaN semiconductor crystal, which has, because of In, a lattice constant largely different from that of semiconductor crystal not including In, such as GaN and AlGaN, is selectively grown so as to be isolated from a substrate, thereby controlling defects to be caused in the InGaN crystal.

Now, the first embodiment of the invention will be described with reference to the accompanying drawing.

Figure 1:
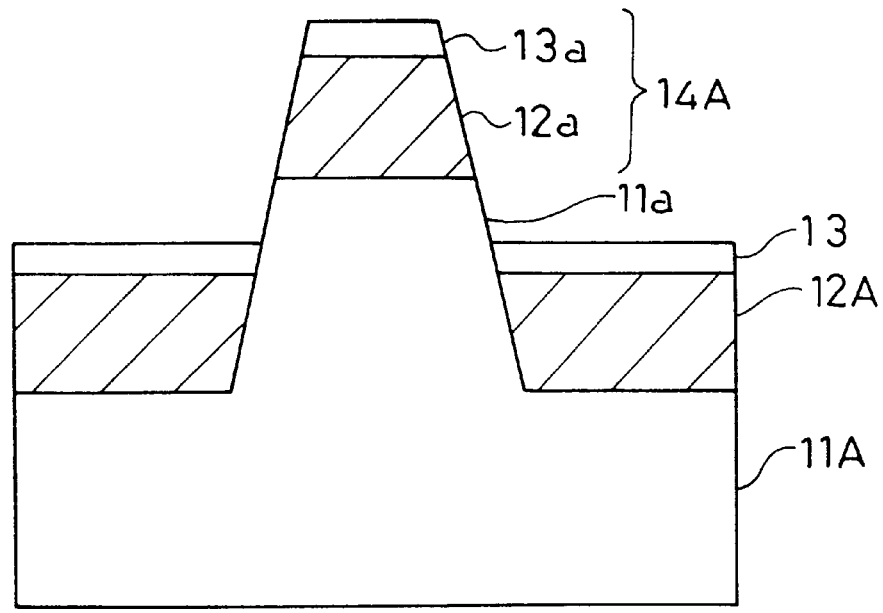
FIG. 1 is a sectional view for showing the structure of a semiconductor obtained by a method of manufacturing a semiconductor according to a first embodiment of the invention.

FIG. 1 shows the sectional structure of a stacked substance including a semiconductor obtained by a method of manufacturing a semiconductor of the first embodiment. The stacked substance is manufactured as follows: First, as is shown in FIG. 1, by using, for example, the metal organic vapor phase growth (MOVPE), on the entire surface of a substrate 11A of sapphire ($Al_2O_3$) having a projection 11a thereon with a width in the lateral direction of approximately 10 $\mu$m, a first semiconductor layer 12A of $Al_yGa_{1-y}N$ (wherein $0 \leq y \leq 1$) as a group III nitride is grown, and on the first semiconductor layer 12A, a second semiconductor layer 13 of $In_xGa_{1-x}N$ is grown. In this manner, on the top surface of the projection 11a of the substrate 11A, an island-like stacked substance 14A including an isolated first semiconductor layer 12a and an isolated second semiconductor layer 13a is formed.

In this first embodiment, the second semiconductor layer 13 of InGaN having a different lattice constant from the first semiconductor layer 12A is not uniformly grown on a flat surface of the substrate as in the general growth but is selectively grown on the top surface of the projection 11a and on a surface parallel to the substrate surface in an area excluding the projection 11a because the crystal is difficult to grow on the side surfaces of the projection 11a of the substrate 11A. As a result, the isolated second semiconductor layer 13a of desired InGaN is grown in a small area with a width of approximately 10 $\mu$m. Therefore, a stress during the growth is applied to the isolated second semiconductor layer 13a in a uniaxial direction alone. Accordingly, strain derived from a difference in the thermal expansion coefficient between the substrate 11A and InGaN can be reduced, resulting in improving the crystallinity of InGaN included in the stacked substance 14A.

Modification of Embodiment 1

Figure 2:
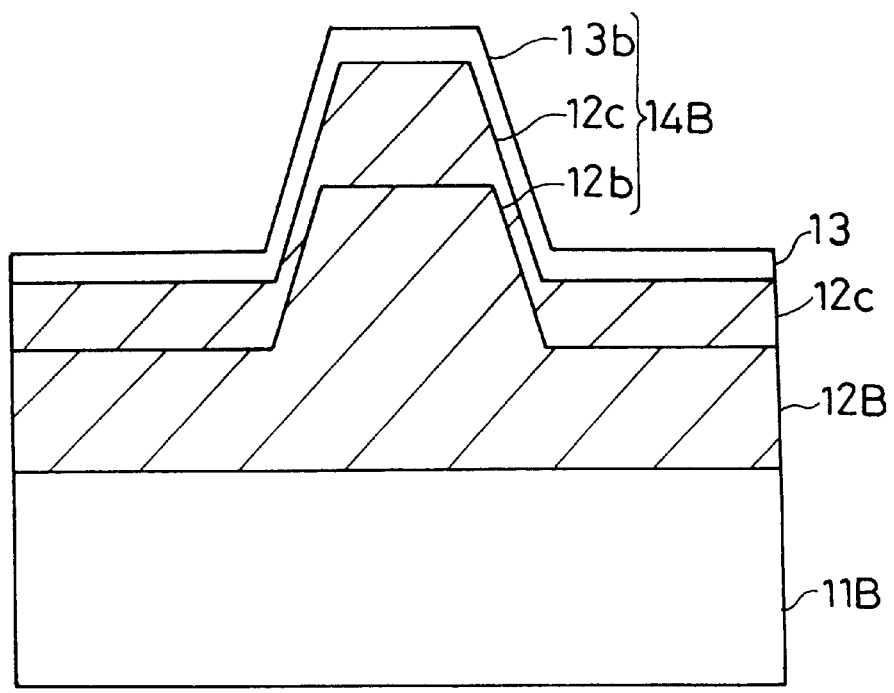
FIG. 2 is a sectional view for showing the structure of a semiconductor obtained by a method of manufacturing a semiconductor according to a modification of the first embodiment.

FIG. 2 shows the sectional structure of a stacked substance including a semiconductor obtained by a method of manufacturing a semiconductor according to a modification of the first embodiment. As is shown in FIG. 2, on a substrate 11B of sapphire, a projection forming layer 12B of $Al_yGa_{1-y}N$ having a projection 12b thereon with a width in the lateral direction of approximately 10 $\mu$m is formed. Then, on the entire top surface of the projection forming layer 12B, a first semiconductor layer 12C of $Al_yGa_{1-y}N$ and a second semiconductor layer 13 of $In_xGa_{1-x}N$ are successively grown by the MOVPE. In this manner, an island-like stacked substance 14B including the top surface of the projection 12b of the projection forming layer 12B, an isolated first semiconductor layer 12c and an isolated second semiconductor layer 13b on the top surface is formed.

In this modification, the second semiconductor layer 13 is not uniformly grown on the substrate 11B but is selectively grown on an area where the growth rate is high, namely, on the top surface of the projection 12b of the projection forming layer 12B and on a surface parallel to the substrate surface in an area excluding the projection 12b of the projection forming layer 12B because of the surface orientation dependency of the growth rate of InGaN crystal. Accordingly, similarly to the first embodiment, a stress during the growth is applied to the isolated second semiconductor layer 13b in the uniaxial direction alone. Therefore, the strain derived from the difference in the thermal expansion coefficient between the substrate 11B and InGaN can be reduced, thereby improving the crystallinity of InGaN included in the stacked substance 14B.

Moreover, since the projection forming layer 12B of AlGaN is formed between the substrate 11B and the first semiconductor layer 12C, the first semiconductor layer 12C can be improved in its crystallinity as compared with the first semiconductor layer 12A shown in FIG. 1. Therefore, the crystallinity of the isolated second semiconductor layer 13b can be further improved.

In the first embodiment and the modification, the projection 11a of the substrate 11A and the projection 12b of the projection forming layer 12B are both described to have a with in the lateral direction of approximately 10 μm, but the same effects can be attained as far as the width is approximately 50 μm or less.

Also, the projections 11a and 11b preferably have a rectangular or trapezoidal section taken in a direction vertical to the substrate surface. When the section is in such a shape, In atoms can be easily diffused from the side surfaces of the projection 11a or 11b to the top surface thereof in growing the second semiconductor layer 13. Accordingly, the composition ratio of In in the isolated second semiconductor layer 13a or 13b can be increased.

Embodiment 2

A second embodiment of the invention will now be described with reference to the accompanying drawings. Also in the second embodiment, InGaN crystal is selectively grown, so that InGaN crystal including less defects can be obtained.

Figure 3:
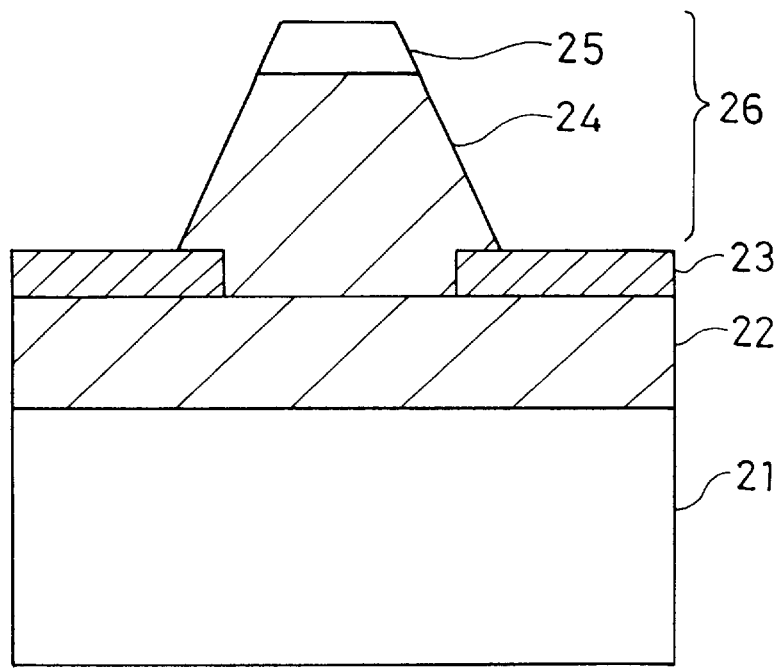
FIG. 3 is a sectional view for showing the structure of a semiconductor obtained by a method of manufacturing a semiconductor according to a second embodiment of the invention.

FIG. 3 shows the sectional structure of a stacked substance including a semiconductor obtained by a method of manufacturing a semiconductor according to the second embodiment. As is shown in FIG. 3, by using, for example, the MOVPE, an under layer 22 of $Al_yGa_{1-y}N$ is grown on the entire surface of a substrate 21 of sapphire, and then, a mask pattern 23 of a silicon oxide ($SiO_2$) film having an opening with a width of approximately 10 μm is formed on the under layer 22. Next, by using the MOVPE again, a first semiconductor layer 24 of $Al_yGa_{1-y}N$ and a second semiconductor layer 25 of $In_xGa_{1-x}N$ are successively grown selectively on the opening of the mask pattern 23 disposed on the under layer 22. In this manner, a stacked substance 26 including the first semiconductor layer 24 and the second semiconductor layer 25 is formed.

In this embodiment, the first semiconductor layer 24 is selectively grown on the opening of the mask pattern 23 formed on the under layer 22, so as to be grown into the shape of a projection on the under layer 22. Accordingly, similarly to the first embodiment, the second semiconductor layer 25 of InGaN is grown in a small area with a width of approximately 10 μm isolatedly from the substrate 21. Therefore, a stress during the growth is applied in the uniaxial direction alone, and the strain derived from the difference in the thermal expansion coefficient between the substrate 21 and InGaN can be reduced, resulting in improving the crystallinity of InGaN.

Also, since the under layer 22 of AlGaN is formed on the substrate 21, the crystallinity of InGaN in the second semiconductor layer 25 can be more remarkably improved.

The mask pattern 23 can be formed out of a silicon nitride ($Si_3N_4$) film instead.

Now, a mechanism for increasing the composition ratio of In in the InGaN crystal with retaining high crystallinity will be described with reference to the accompanying drawing. The mechanism can be similarly applied also to the first embodiment and the modification, but the description will be herein given on the basis of the second embodiment.

Figure 4:
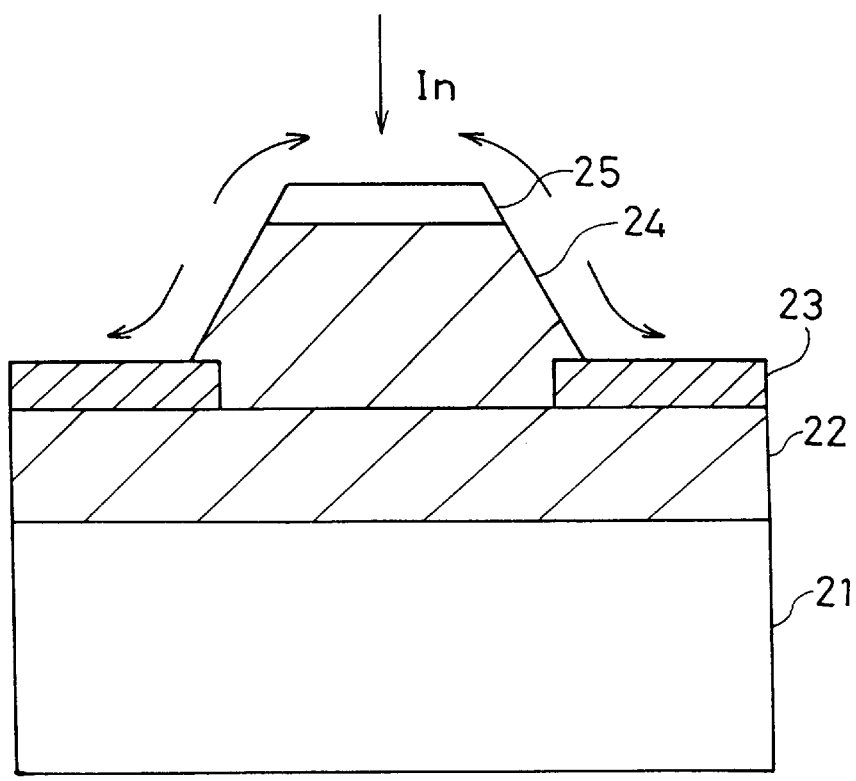
FIG. 4 is a schematic sectional view for illustrating diffusion of In atoms during growth of a semiconductor layer of InGaN in the method of manufacturing a semiconductor of the second embodiment.

FIG. 4 is a sectional view for showing diffusion of In atoms during the selective growth of the second semiconductor layer 25 of InGaN. In FIG. 4, like reference numerals are used to refer to like elements shown in FIG. 3 and the description is omitted. As is shown in FIG. 4, in the epitaxial growth of the second semiconductor layer 25, for example, Ga atoms supplied unto the substrate 21 are easily accumulated on a flat surface parallel to the substrate surface as compared with on a side surface of growing crystal, and hence, excessive Ga atoms not accumulated on the side surface are diffused onto and accumulated on the flat surface. This phenomenon is also caused with regard to In atoms, and since In atoms are diffused from the side surfaces of the first semiconductor layer 24, the amount of In atoms accumulated on the flat surface, namely, the top surface of the first semiconductor layer 24 in the shape of the projection, is increased. As a result, InGaN crystal with a large composition ratio of In can be grown. Accordingly, under such a growth condition, the In atoms are collectively accumulated in a selected growth area, so that the composition ratio x of In can be approximated to 1 as far as possible in the range of $0 \leq x \leq 1$.

Furthermore, when this second semiconductor layer 25 of InGaN is used as an active layer in a light emitting diode, the volume of the active layer can be minimized during the growth, and hence, an operation current can be largely decreased owing to an effect of the decreased volume. As a result, the light emitting diode can be suppressed from emitting heat due to the small operation current, thereby largely improving the reliability of the diode.

As a result of examination of the third paper, it is regarded that the selectively grown second semiconductor layer 25 of InGaN can be grown into a thickness exceeding the critical thickness without introducing a defect such as misfit dislocation.

In the case where a semiconductor layer having a large composition ratio of In is formed through the diffusion of In as in the first and second embodiments, the projection preferably has a rectangular or trapezoidal section taken in a direction vertical to the substrate surface as described above.

Also, the second embodiment exhibits the following remarkable characteristics in manufacturing a light emitting diode by adopting this crystal growth:

First, fourth paper "Applied Physics Letters, Vol. 68 (1996) pp. 976–978" describes a method of selectively forming a semiconductor layer of GaN after directly depositing $SiO_2$ or the like on a substrate of sapphire as a mask. When a light emitting diode is to be manufactured by using an insulating substrate such as sapphire in this manner, it is generally necessary to form both p-type and n-type electrodes on a surface of a device forming area of the substrate. Therefore, it is necessary to bare a contact layer closer to the substrate by removing the GaN layer by drying etching or the like, and hence, the etching is required to be highly accurately controlled.

In contrast, in the second embodiment, when, for example, the under layer 22 is used as the contact layer, the contact layer can be easily bared with high reproducibility merely by removing the mask pattern 23 through wet etching.

Furthermore, since the dry etching is thus not adopted in baring the contact layer closer to the substrate, the manufacturing cost can be decreased. In addition, since the contact layer is thus prevented from being damaged through the etching, the light emitting diode can be manufactured without degrading the crystallinity of the contact layer, resulting in largely improving the yield of the light emitting diode.

Embodiment 3

A third embodiment of the invention will now be described with reference to the accompanying drawings. In this embodiment, a semiconductor substrate of GaN is manufactured by a method of growing GaN crystal using the mask pattern for the selective growth described in the second embodiment.

Figure 5A:
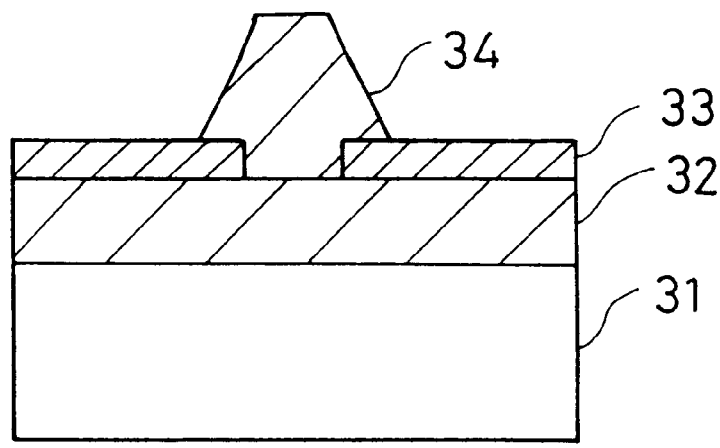
FIGS. 5(a) through 5(c) are sectional views for showing procedures in a method of manufacturing a semiconductor substrate according to a third embodiment of the invention.

FIGS. 5(a) through 5(c), 6(a) and 6(b) are sectional views for showing procedures in a method of manufacturing a semiconductor substrate of the third embodiment. First, as is shown in FIG. 5(a), an under layer 32 of GaN is grown on the entire surface of a substrate 31 of sapphire by, for example, the MOVPE, and then, a mask pattern 33 of a $SiO_2$ film having an opening with a width of approximately 10 $\mu$m is grown on the under layer 32. By using the MOVPE again, a semiconductor layer 34 of GaN is selectively grown on the opening of the mask pattern 33 on the under layer 32.

Figure 5B:
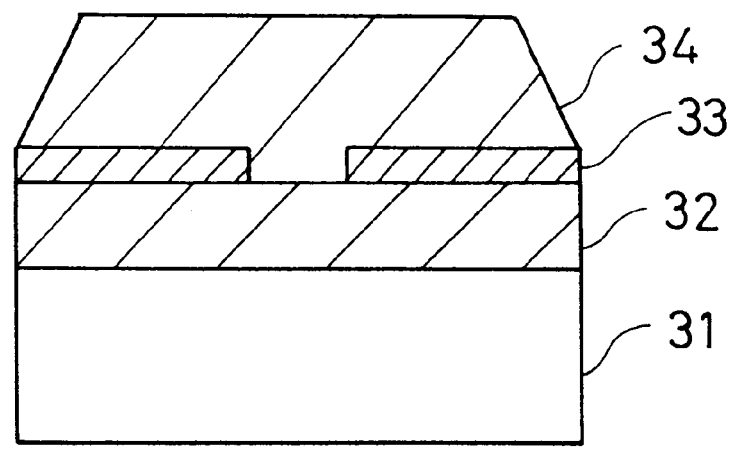
Figure 5C:
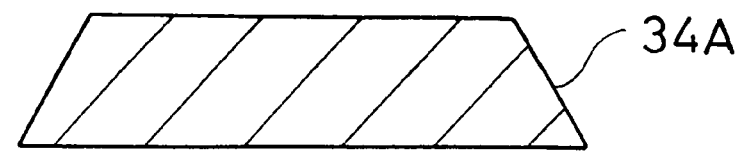

The semiconductor layer 34 is further grown so as to expand in the periphery of the opening of the mask pattern 33 as is shown in FIG. 5(b), and then, the substrate 31, the under layer 32 and the mask pattern 33 are mechanically polished as is shown in FIG. 5(c), thereby obtaining a semiconductor substrate 34A of GaN.

Figure 6A:
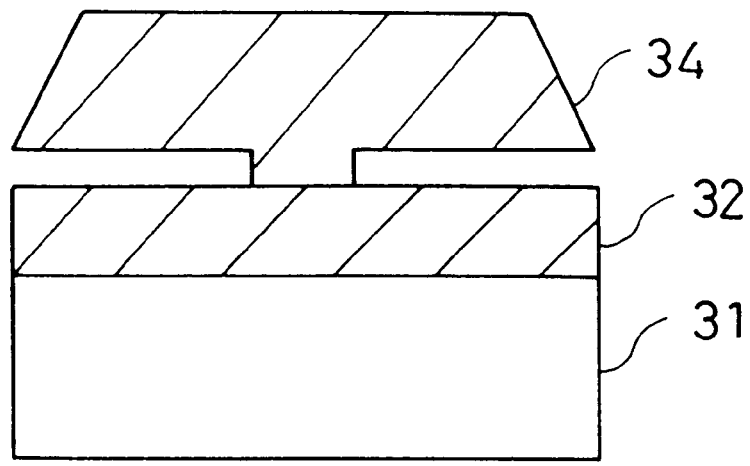
FIGS. 6(a) and 6(b) are sectional views for showing other procedures in the method of manufacturing a semiconductor substrate of the third embodiment.
Figure 6B:
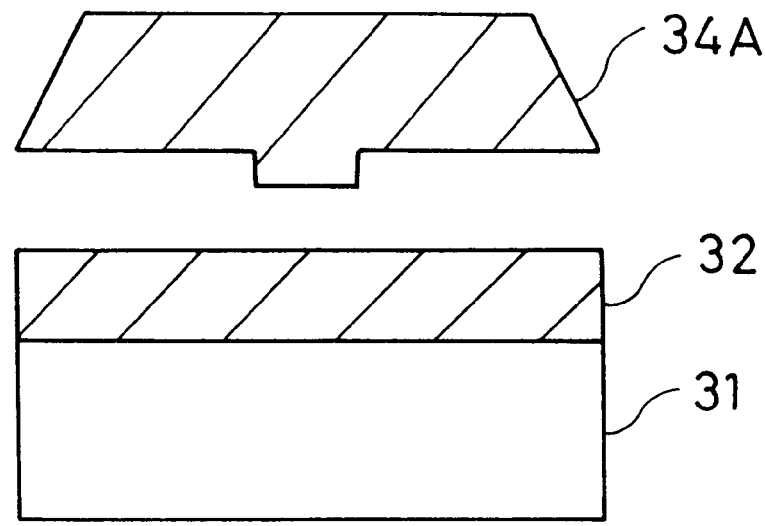

Alternatively, the semiconductor substrate 34A can be taken out by removing the mask pattern 33 with an aqueous solution of hydrofluoric acid as is shown in FIG. 6(a), and then by separating a contact portion between the under layer 32 and the semiconductor layer 34 through application of microvibration (ultrasonic vibration) to the entire substrate 31 as is shown in FIG. 6(b).

In this embodiment, when a defect is caused in the under layer 32, the defect extends to an upper portion of the substrate 31. Accordingly, since the mask pattern 33 is formed below the semiconductor layer 34 grown in the periphery of the opening of the mask pattern 33, the mask pattern 33 works as a defect stopper, resulting in preventing the defect from extending. Therefore, the GaN crystal grown on the mask pattern 33 has very good crystallinity.

The under layer 32 is not indispensable but is preferably formed in order to improve the crystallinity of the semiconductor layer 34 as described above.

Embodiment 4

A fourth embodiment of the invention will now be described with reference to the accompanying drawing. According to this embodiment, a p-type GaN semiconductor with a low resistance can be definitely obtained.

Figure 7:
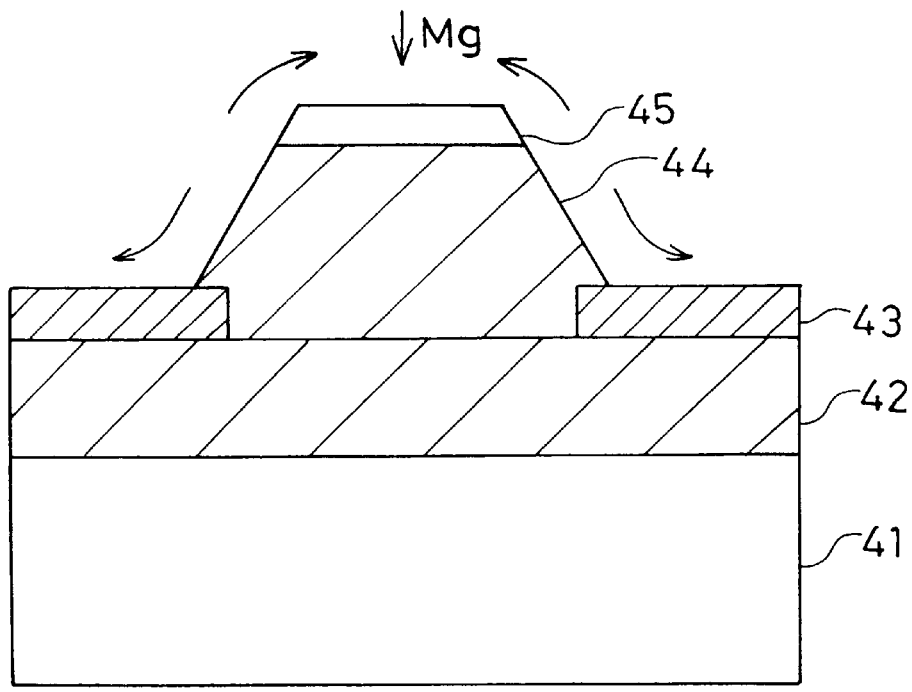
FIG. 7 is a sectional view for showing the structure of a semiconductor obtained by a method of manufacturing a semiconductor according to a fourth embodiment of the invention.

FIG. 7 shows the sectional structure of a semiconductor obtained by a method of manufacturing a semiconductor of the fourth embodiment. As is shown in FIG. 7, an under layer 42 of $Al_yGa_{1-y}N$ is first grown on the entire surface of a substrate 41 of sapphire by the MOVPE, and then, a mask pattern 43 of a $SiO_2$ film having an opening with a width of approximately 10 $\mu$m is grown on the under layer 42. By using the MOVPE again, a semiconductor layer 44 of $Al_yGa_{1-y}N$ is selectively grown on the opening of the mask pattern 43 on the under layer 42. Subsequently, with a bis(cyclopentadienyl)magnesium ($Cp_2Mg$) gas supplied onto the substrate 41 as a p-type dopant, a p-type semiconductor layer 45 of $Al_yGa_{1-y}N$ is selectively grown on the semiconductor layer 44.

In general, in order to decrease the resistance of the p-type semiconductor layer 45, the concentration of Mg in the p-type semiconductor layer 45 is increased by increasing the supply rate of the $Cp_2Mg$ gas during the growth of the p-type semiconductor layer 45. However, exessive supply of the $Cp_2Mg$ gas can roughen the crystal surface of the p-type semiconductor layer 45, resulting in causing a defect Mg is concerned with. Therefore, the exessive supply can reversely increase the resistance or change the p-type semiconductor layer 45 into an n-type conductivity.

However, according to this embodiment, Mg atoms of the p-type dopant are hardly caught by the side surfaces of the semiconductor layer 44 but are exessively caught by the flat surface parallel to the substrate surface as is shown in FIG. 7. Owing to this mechanism for the selective growth, the concentration of Mg can be easily and definitely increased without exessively supplying the $Cp_2Mg$ gas.

Accordingly, the p-type semiconductor layer 45 with a low resistance can be easily obtained through this selective growth. Therefore, when the manufacturing method of this embodiment is used for forming a p-type contact layer of a light emitting diode, the resultant light emitting diode can be operated at a low voltage and can be prevented from emitting heat. Thus, the reliability of the diode can be improved.

It is noted that the semiconductor layer 44 preferably has a rectangular or trapezoidal section taken in a direction vertical to the substrate surface as is shown in FIG. 7. When the semiconductor layer 44 has such a section, the Mg atoms can be easily diffused onto the top surface of the semiconductor layer 44, and hence, the concentration of Mg in the p-type semiconductor layer 45 can be more definitely increased.

Furthermore, the semiconductor layer 44 in the shape of a projection is formed through the selective growth on the opening of the mask pattern 43 in this embodiment, but alternatively, the substrate 41 can be directly provided with a projection as described in the first embodiment, or the under layer 42 can be directly provided with a projection.

Embodiment 5

A fifth embodiment of the invention will now be described with reference to the accompanying drawings.

Figure 8:
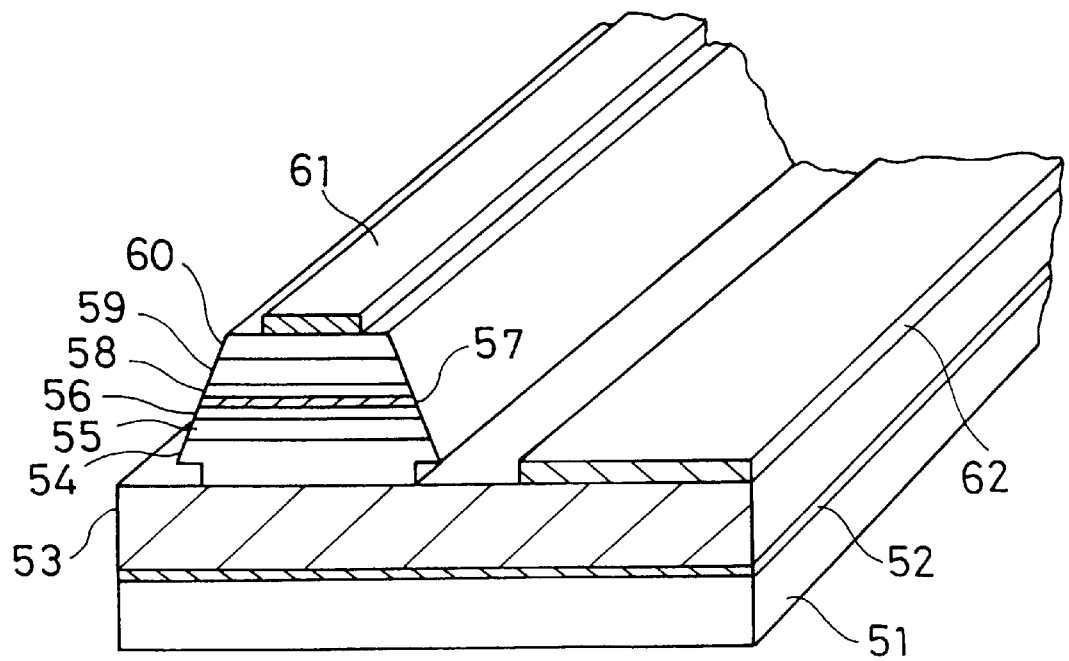
FIG. 8 is a perspective view for showing the sectional structure of a semiconductor device according to a fifth embodiment of the invention.

FIG. 8 shows the sectional structure of a semiconductor device of the fifth embodiment, namely, a GaN semiconductor light emitting diode. As is shown in FIG. 8, on a substrate 51 of sapphire, a low temperature buffer layer 52 of GaN grown at a low temperature and an n-type contact layer 53 of $n^+$-type GaN are formed. On the n-type contact layer 53, epitaxial layers are selectively grown as follows: Above the substrate 51, a buffer layer 54 of $n^+$-type GaN, an n-type cladding layer 55 of n-type $Al_{0.1}Ga_{0.9}N$, a first light guiding layer 56 of GaN, a strain quantum well active layer 57 of $In_{0.20}Ga_{0.80}N$, a second light guiding layer 58 of GaN, a p-type cladding layer 59 of p-type $Al_{0.1}Ga_{0.9}N$, and a p-type contact layer 60 of $p^+$-type GaN are successively formed in this order.

On the p-type contact layer 60, a p-type electrode 61 of Ni/Au is formed, and on the n-type contact layer 53, an n-type electrode 62 of Ti/Al is formed.

A method of manufacturing the semiconductor device having the aforementioned structure will now be described in detail with reference to the accompanying drawings.

FIGS. 9(a) through 9(d) and 10(a) through 10(c) are sectional views for showing procedures in the method of manufacturing a semiconductor device of this embodiment. First, the surface of the substrate 51 of sapphire is ultrasonically cleaned by using an organic solvent. Then, the cleaned substrate 51 is held in a susceptor in a reaction furnace of an MOVPE system (not shown), and the reaction furnace is evacuated. Then, the inside of the reaction furnace is set in an atmosphere of hydrogen at a pressure of 70 Torr and the temperature is increased to approximately 1100° C., so that the substrate 51 can be heated for cleaning for approximately 15 minutes.

Figure 9A:
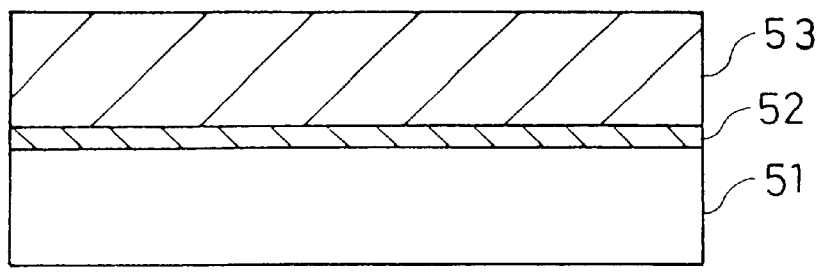
FIGS. 9(a) through 9(d) are sectional views for showing procedures in a method of manufacturing a semiconductor device of the fifth embodiment.

Next, after decreasing the temperature in the reaction furnace to approximately 500° C., trimethylgallium (TMG), ammonia ($NH_3$) gas and carrier hydrogen are simultaneously supplied onto the surface of the substrate 51 at supply rates of 2 μmol/min., 2.5 L/min. and 2 L/min., respectively, thereby forming the low temperature buffer layer 52 of GaN with a thickness of approximately 50 nm as is shown in FIG. 9(a). Then, the temperature in the reaction furnace is increased to approximately 1000° C., and silane ($SiH_4$) gas as an n-type dopant is further supplied onto the surface of the substrate 51, thereby forming the n-type contact layer 53 having a thickness of approximately 3 μm and a Si impurity concentration of $1\times10^{18}$ $cm^{-3}$ on the low temperature buffer layer 52.

Figure 9B:
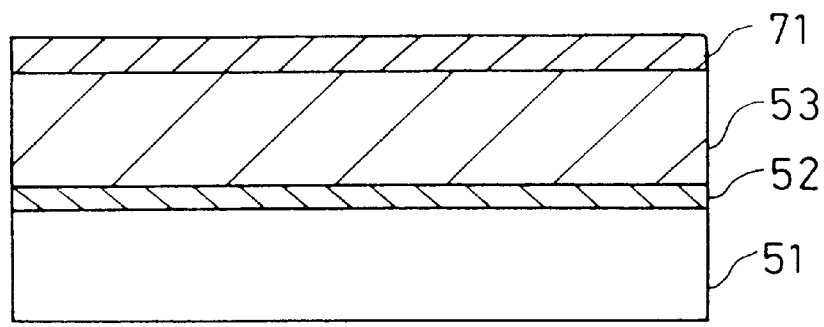

Then, after the substrate 51 is taken out of the reaction furnace and the surface of the n-type contact layer 53 is cleaned, a mask forming film 71 of $SiO_2$ with a thickness of approximately 0.1 μm is deposited on the entire surface of the substrate 51 by, for example, the CVD as is shown in FIG. 9(b).

Figure 9C:
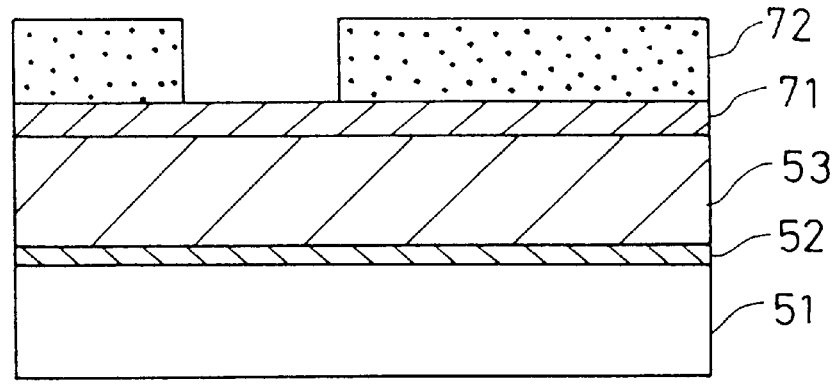

Next, as is shown in FIG. 9(c), a resist film is coated on the entire surface of the substrate 51 by using a spinner, and a resist pattern 72 having plural stripe-shaped openings each having a width of approximately 10 μm with a pitch of 300 μm is formed on the resist film by the photolithography. In FIG. 9(c), merely one opening is shown for the sake of convenience. Although the opening has a width of 10 μm in this embodiment, the width can be approximately 5 μm through 50 μm.

Figure 9D:
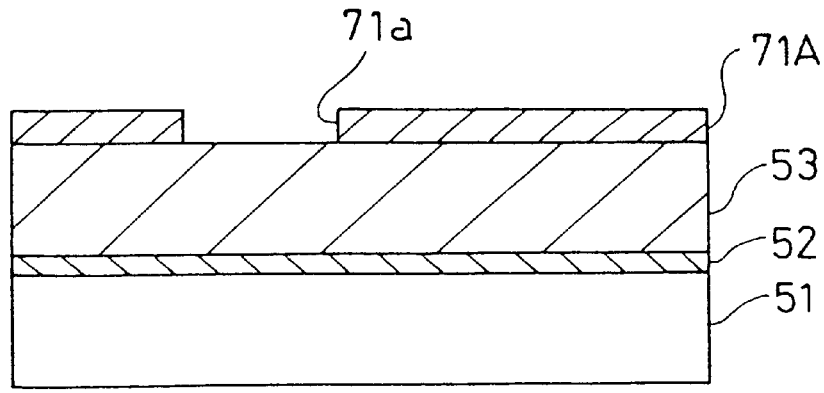

Subsequently, by using the resist pattern 72 as a mask, the mask forming film 71 is removed through wet etching using an aqueous solution of hydrofluoric acid, thereby forming a mask pattern 71A of $SiO_2$ for the selective growth including stripe-shaped openings 71a as is shown in FIG. 9(d). Then, the resist pattern 72 is removed, so that the n-type contact layer 53 can be bared in the shape of stripes with a width of 10 μm.

Figure 10A:
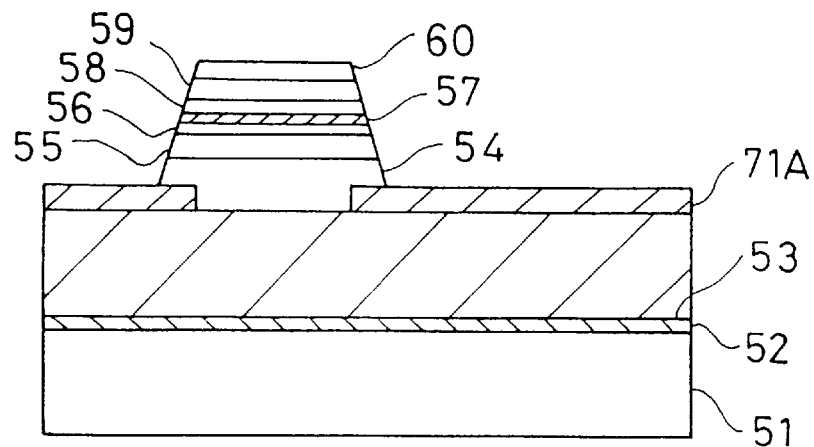
FIGS. 10(a) through 10(c) are sectional views for showing other procedures in the method of manufacturing a semiconductor device of the fifth embodiment.

Then, the substrate 51 bearing the mask pattern 71A is placed in the reaction furnace again, so as to grow the respective epitaxial layers to be used for forming a light emitting diode as is shown in FIG. 10(a). As described in the second embodiment, when semiconductor crystal is grown on the substrate 51, the semiconductor crystal is not grown on the mask pattern 71A but is selectively grown on the opening 71a of the mask pattern 71A. At this point, the process conditions such as the growth temperature are set so that the growing semiconductor crystal can attain a trapezoidal section taken in a direction vertical to the substrate 51 and also to the stripe-shaped opening 71a.

Specifically, the respective epitaxial layers are formed as follows: First, with the temperature in the reaction furnace set at approximately 1000° C., the buffer layer 54 of $n^+$-type GaN having a thickness of approximately 0.1 μm and the Si impurity concentration of $1\times10^{18}$ $cm^{-3}$ is formed on the opening 71a of the mask pattern 71A on the n-type contact layer 53. Then, with trimethylaluminum (TMA) also supplied onto the surface of the substrate 51, the n-type cladding layer 55 of n-type $Al_{0.1}Ga_{0.9}N$ having a thickness of approximately 0.3 μm and the Si impurity concentration of $1\times10^{17}$ $cm^{-3}$ is formed on the substrate 51. Subsequently, after growing the first light guiding layer 56 of GaN having a thickness of approximately 60 nm, the temperature is decreased to approximately 750° C., and with trimethylindium (TMI) and a nitrogen gas further supplied onto the surface of the substrate 51, the strain quantum well active layer 57 of $In_{0.20}Ga_{0.80}N$ with a thickness of 3 nm is grown. Then, the temperature in the reaction furnace is increased again to approximately 1000° C., and the second light guiding layer 58 of GaN with a thickness of approximately 60 nm is grown. Subsequently, with the $Cp_2Mg$ gas supplied as the p-type dopant, the p-type cladding layer 59 of p-type $Al_{0.1}Ga_{0.9}N$ having a thickness of approximately 0.3 μm and a Mg impurity concentration of $1\times10^{17}$ $cm^{-3}$ is grown. Then, the p-type contact layer 60 of $p^+$-type GaN having a thickness of approximately 0.1 μm and the Mg impurity concentration of $1\times10^{18}$ $cm^{-3}$ is grown.

Figure 10B:
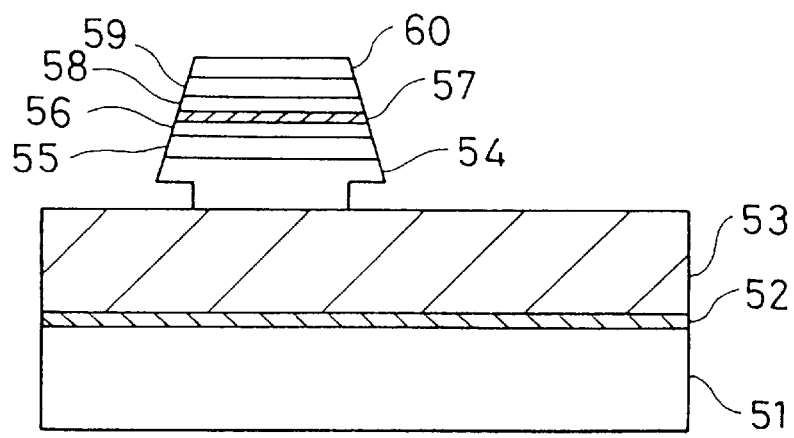

Next, the substrate 51 bearing the respective epitaxial layers is taken out of the reaction furnace, and the mask pattern 71A is removed by the wet etching using an aqueous solution of hydrofluoric acid as is shown in FIG. 10(b).

Figure 10C:
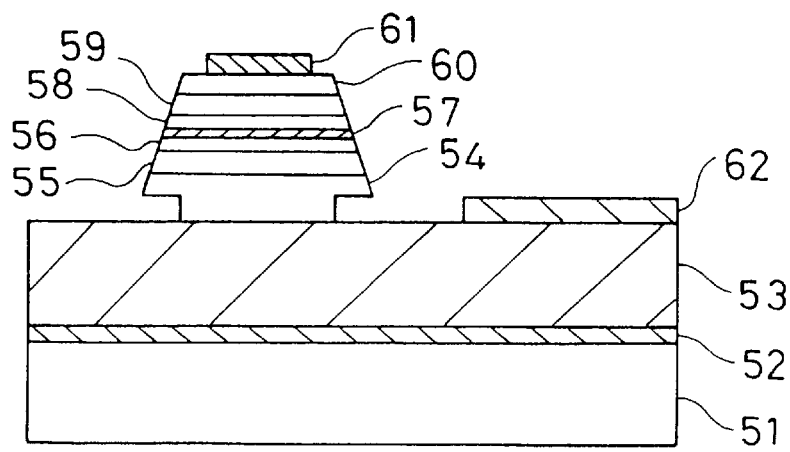

Subsequently, as is shown in FIG. 10(c), the p-type electrode 61 of stripe-shaped Ni/Au is formed on the top surface of the p-type contact layer 60. Also, the n-type electrode 62 of Ti/Al is formed on the bared n-type contact layer 53. Furthermore, a resonator of the light emitting diode is formed through the dry etching and cleavage, and highly reflective coatings having reflectance of 90% and 70% are provided on the respective cleaved ends.

In the above description, silicon oxide is used in the mask pattern 71A but silicon nitride can be used instead.

The GaN semiconductor light emitting diode of this embodiment has the following various characteristics:

First, since the strain quantum well active layer 57 of $In_xGa_{1-x}N$ is isolated from the substrate 51 so as not to be supplied with a two-dimensional stress, the composition ratio x of In can be approximated to 1 without degrading the crystallinity. Therefore, the light emitting diode can exhibit high luminance in a wavelength region ranging from the UV to the orange-colored light.

Second, since the strain quantum well active layer 57 of $In_xGa_{1-x}N$ is minimized in its volume owing to the selective growth, the operation current can be largely decreased due to the effect of the decreased volume of the strain quantum well active layer 57. As a result, the light emitting diode can be suppressed from emitting heat, thereby largely improving the reliability thereof.

Thirdly, since the p-type contact layer 60 is selectively grown, the resistance thereof can be easily and definitely decreased without excessively supplying the p-type dopant. Accordingly, the light emitting diode can be operated at a low voltage and the reliability thereof can be remarkably improved.

Fourthly, the mask pattern 71A for the selective growth can be easily and definitely removed by the wet etching, and hence, the n-type electrode 62 can be easily formed. When an insulating substrate such as sapphire is used, it is generally necessary to conduct dry etching from the surface of the p-type contact layer 60 in order to bare the n-type contact layer 53 as described in the second embodiment, which can makes the manufacturing process complicated. In contrast, in the method of this embodiment, the process for baring the p-type contact layer 60 can be very easily carried out. Accordingly, the manufacturing cost can be decreased, and the yeild can be increased because the etching can be well controlled.

Embodiment 6

A sixth embodiment of the invention will now be described with reference to the accompanying drawings.

Figure 11:
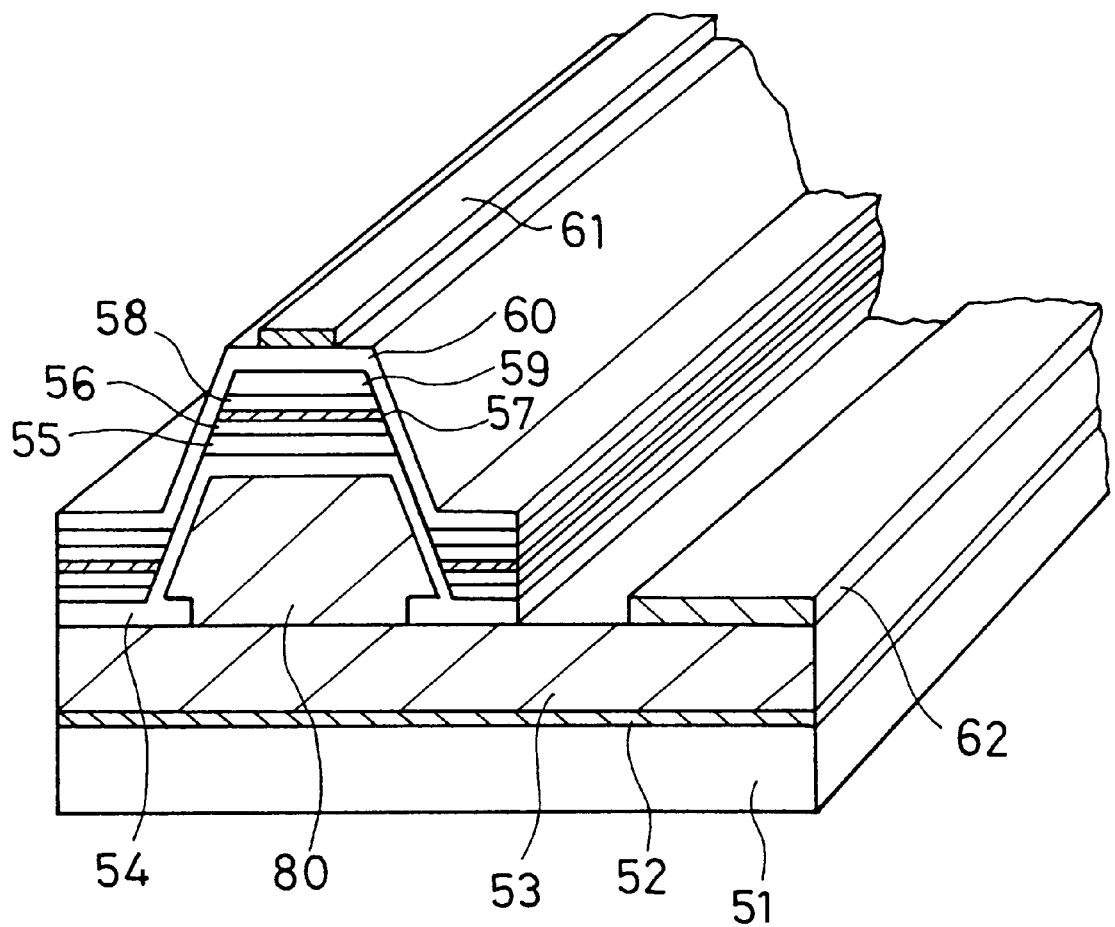
FIG. 11 is a perspective view for showing the sectional structure of a semiconductor device according to a sixth embodiment of the invention.

FIG. 11 shows the sectional structure of a semiconductor device of the sixth embodiment, namely, a GaN semiconductor light emitting diode. In FIG. 11, like reference numerals are used to refer to like elements shown in FIG. 8, and the description is omitted. As is shown in FIG. 11, the semiconductor device of this embodiment is characterized by a strain quantum well active layer 57 formed above a stripe-shaped projection forming layer 80 of n-type GaN selectively formed on an n-type contact layer 53.

Now, a method of manufacturing the semiconductor device having the aforementioned structure will be described in detail with reference to the accompanying drawings.

Figure 12A:
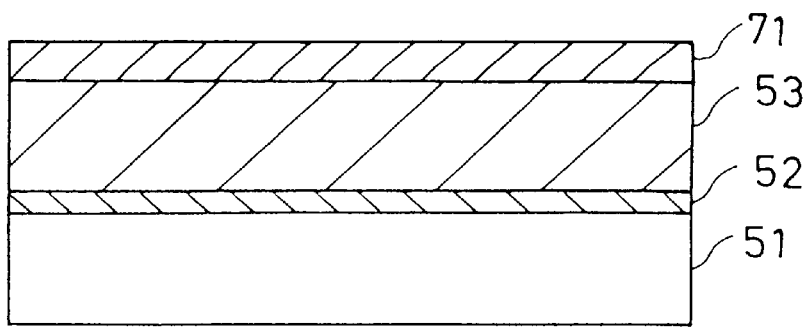
FIGS. 12(a) through 12(d) are sectional views for showing procedures in a method of manufacturing a semiconductor device of the sixth embodiment.

FIGS. 12(a) through 12(d) and 13(a) through 13(c) are sectional views for showing procedures in the method of manufacturing a semiconductor device of this embodiment. A substrate 51 of sapphire is desirably cleaned and the substrate 51 is placed in a reaction furnace of an MOVPE system (not shown). After conducting heat cleaning of the surface of the substrate 51 as is shown in FIG. 12(a), a low temperature buffer layer 52 and the n-type contact layer 53 are grown on the substrate 51 in the same manner as described in the fifth embodiment. Then, the substrate 51 is taken out of the reaction furnace, and a mask forming film 71 of $SiO_2$ is deposited on the entire surface of the n-type contact layer 53 by the CVD or the like.

Figure 12B:
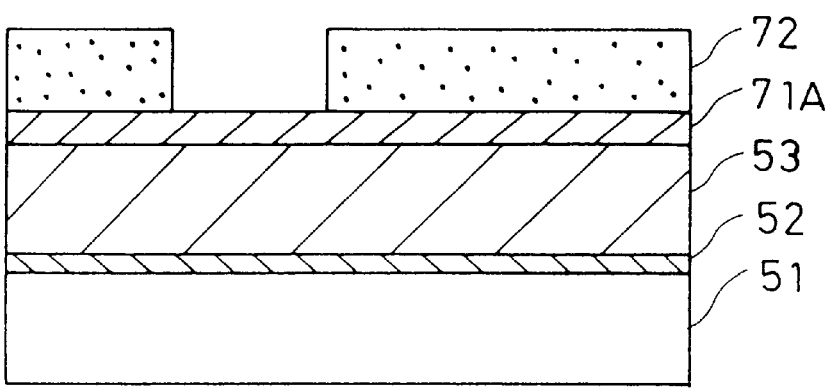
Figure 12C:
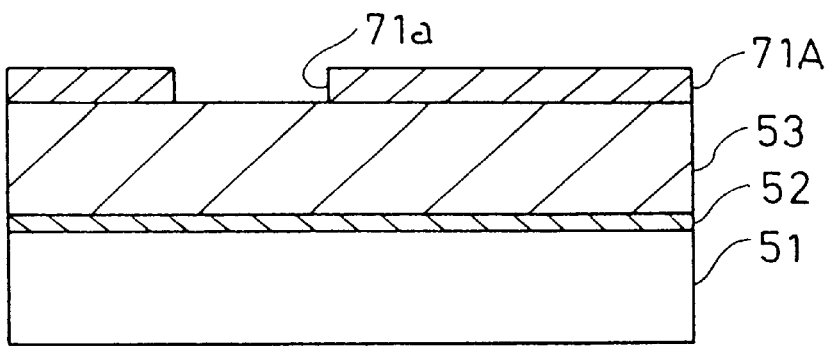

Next, as is shown in FIG. 12(b), a resist pattern 72 having plural stripe-shaped openings each with a width of 10 μm is formed. Then, as is shown in FIG. 12(c), by using the resist pattern 72 as a mask, a mask pattern 71A having an opening 71a for the selective growth is formed out of the mask forming film 71.

Figure 12D:
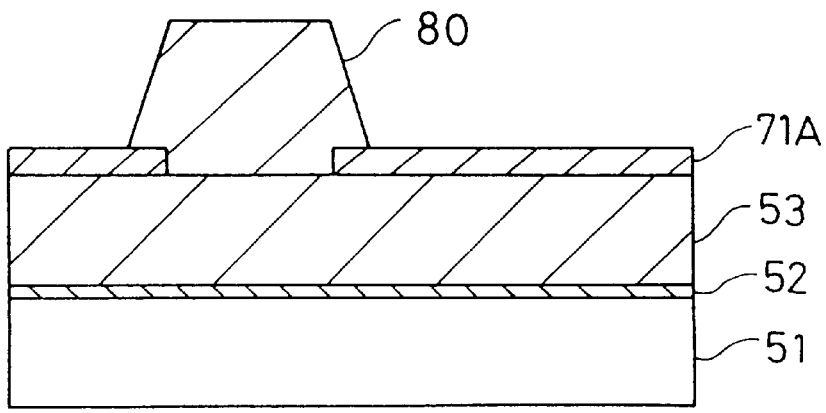

Subsequently, as is shown in FIG. 12(d), the n-type projection forming layer 80 having a thickness of approximately 1 μm and a Si impurity concentration of $1 \times 10^{18}$ cm$^{-3}$ is selectively grown on the opening 71a of the mask pattern 71A on the n-type contact layer 53. Also in this case, the process conditions such as the growth temperature are set so that the projection forming layer 80 can attain a trapezoidal section taken in a direction vertical to the substrate 51 and also to the stripe-shaped opening 71a.

Figure 13A:
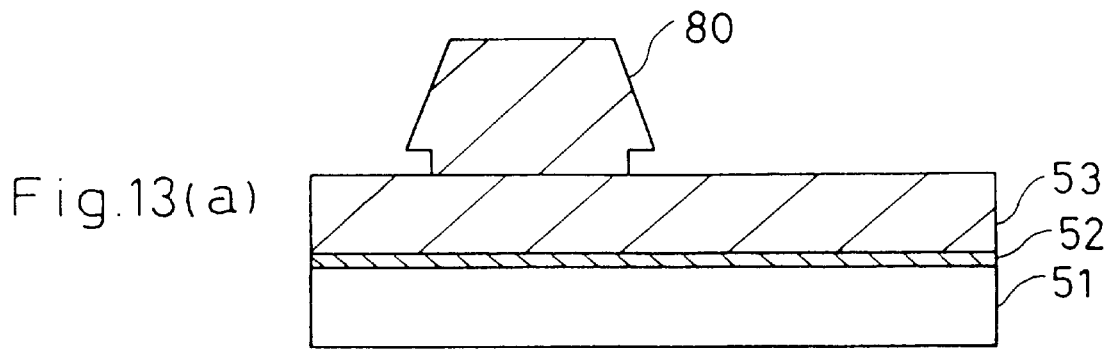
FIGS. 13(a) through 13(c) are sectional views for showing other procedures in the method of manufacturing a semiconductor device of the sixth embodiment.

Next, the substrate 51 bearing the projection forming layer 80 is taken out of the reaction furnace, and the mask pattern 71A is removed by the wet etching using an aqueous solution of hydrofluoric acid as is shown in FIG. 13(a).

Figure 13B:
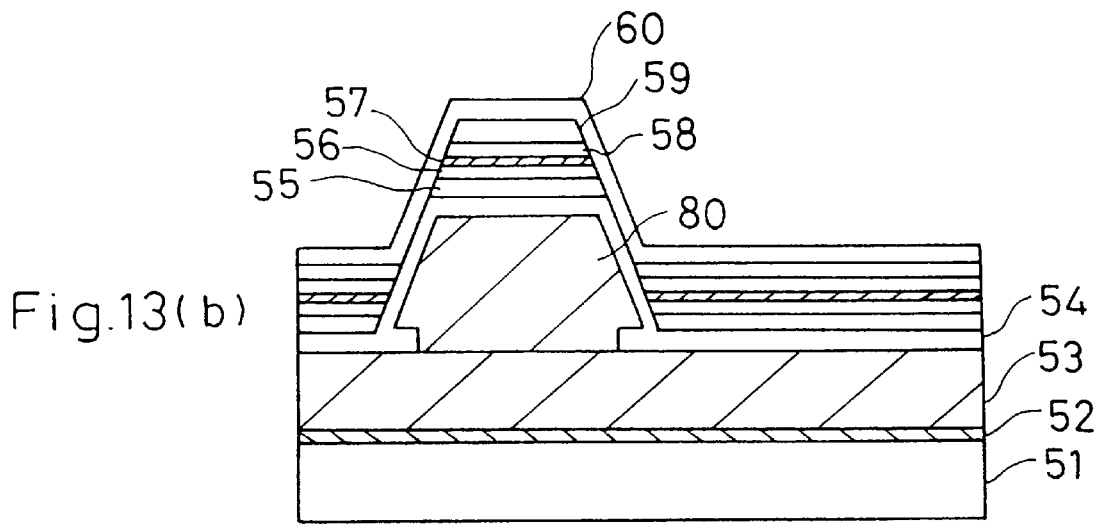

Then, the substrate 51 from which the mask pattern 71A is removed is placed in the reaction furnace again, and respective epitaxial layers are grown on the entire surface of the substrate 51 as is shown in FIG. 13(b). Thus, the light emitting diode can be formed on the top surface of the projection forming layer 80. Specifically, under the same growth conditions for the epitaxial layers as described in the fifth embodiment, a buffer layer 54 of n$^+$-type GaN, an n-type cladding layer 55 of n-type $Al_{0.1}Ga_{0.9}N$, a first light guiding layer 56 of GaN, the strain quantum well active layer 57 of $In_{0.20}Ga_{0.80}N$, a second light guiding layer 58 of GaN, a p-type cladding layer 59 of p-type $Al_{0.1}Ga_{0.9}N$, and a p-type contact layer 60 of p$^+$-type GaN are successively grown on the n-type contact layer 53.

Figure 13C:
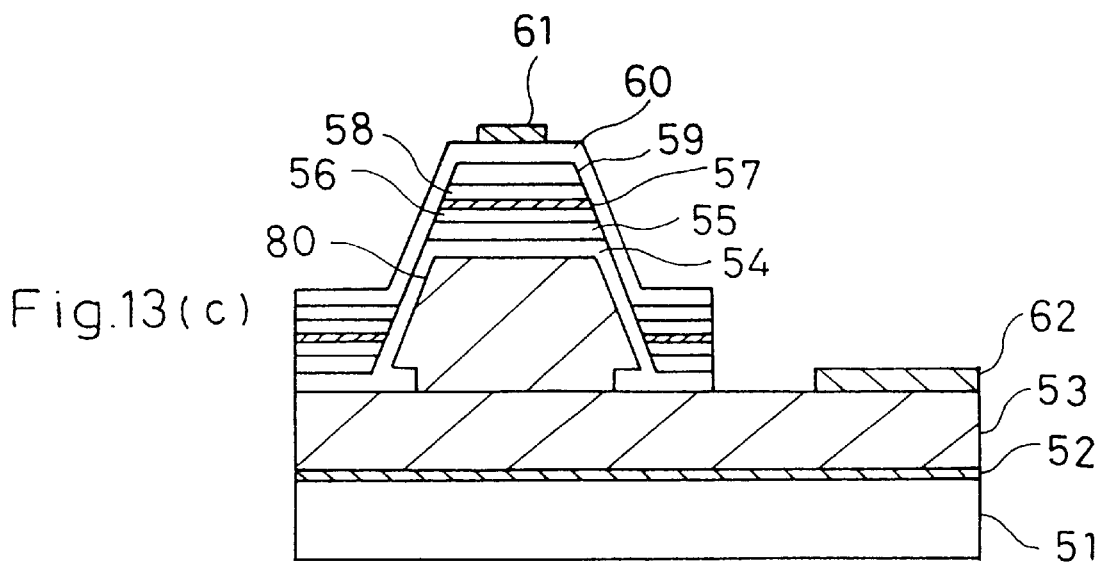

Next, as is shown in FIG. 13(c), the substrate 51 bearing the respective epitaxial layers is taken out of the reaction furnace, and the respective epitaxial layers are dry etched with an area including the projection forming layer 80 of the substrate 51 masked, thereby baring the n-type contact layer 53. Thereafter, a p-type electrode 61 of stripe-shaped Ni/Au is formed on the top surface of the p-type contact layer 60, and an n-type electrode 62 of Ti/Al is formed on the bared n-type contact layer 53.

Since the buffer layer 54 has an n-type impurity concentration similar to that of the n-type contact layer 53, there is no need to accurately control the dry etching conducted on the epitaxial layers as far as the vicinity of the interface between the n-type contact layer 53 and the buffer layer 54 can be bared.

The GaN semiconductor light emitting diode of this embodiment has the following various characteristics similarly to that of the fifth embodiment:

First, since the strain quantum well active layer 57 of $In_xGa_{1-x}N$ is isolated from the substrate 51 so as not to be supplied with the two-dimensional stress, the composition ratio x of In can be approximated to 1 without degrading the crystallinity. Therefore, the light emitting diode can attain high luminance in a wavelength region ranging from the UV to the orange-colored light.

Second, since the strain quantum well active layer 57 of $In_xGa_{1-x}N$ is minimized in its volume owing to the selective growth, the operation current can be largely decreased due to the effect of the decreased volume of the strain quantum well active layer 57. As a result, the light emitting diode can be suppressed from emitting heat, thereby largely improving the reliability thereof.

Thirdly, since the p-type contact layer 60 is selectively grown, the resistance thereof can be easily and definitely decreased without excessively supplying the p-type dopant. Accordingly, the light emitting diode can be operated at a low voltage, and the reliability thereof can be remarkably improved.

When an insulating substrate such as sapphire is not used as the substrate 51 but a conductive substrate of silicon carbide (SiC) or the like is used, there is no need to conduct the dry etching for baring the n-type contact layer 53 because the n-type electrode can be formed on the back surface of the conductive substrate 51.

Also, in each of the fifth and sixth embodiments, GaN is used as the n-type contact layer 53, but $Al_yGa_{1-y}N$ can be used instead.

What is claimed is:

1. A method of manufacturing a semiconductor comprising the steps of:
    growing a first semiconductor layer of a group III nitride on an entire surface of a substrate having a projection thereon; and
    growing a second semiconductor layer of $In_xGa_{1-x}N$, wherein $0 \leq x \leq 1$, on an entire surface of said first semiconductor layer, whereby an island-like stacked substance including said first semiconductor layer and said second semiconductor layer is formed on a top surface of said projection of said substrate.

2. The method of manufacturing a semiconductor of claim 1, wherein said stacked substance has a rectangular or trapezoidal section taken in a direction vertical to the surface of said substrate.

3. A method of manufacturing a semiconductor comprising the steps of:

growing, on a substrate, a first semiconductor layer of a group III nitride having a projection thereon; and growing a second semiconductor layer of $In_xGa_{1-x}N$, wherein $0 \leq x \leq 1$, on an entire surface of said first semiconductor layer, whereby an island-like stacked substance including said first semiconductor layer and said second semiconductor layer is formed on a top surface of said projection of said first semiconductor layer.

4. The method of manufacturing a semiconductor of claim 3, wherein said stacked substance has a rectangular or trapezoidal section taken in a direction vertical to a surface of said substrate.

5. A method of manufacturing a semiconductor comprising the steps of:

forming, on a substrate, a mask pattern for selective growth having an opening;

growing a first semiconductor layer of a group III nitride on said opening of said mask pattern on said substrate; and growing a second semiconductor layer of $In_xGa_{1-x}N$, wherein $0 \leq x \leq 1$, on said first semiconductor layer, whereby a stacked substance including said first semiconductor layer and said second semiconductor layer is selectively formed on said opening of said mask pattern on said substrate.

6. The method of manufacturing a semiconductor of claim 5, wherein said mask pattern is formed out of silicon oxide or silicon nitride.

7. The method of manufacturing a semiconductor of claim 5, wherein said stacked substance has a rectangular or trapezoidal section taken in a direction vertical to a surface of said substrate.

8. A method of manufacturing a semiconductor comprising a step of growing a group III nitride on an entire surface of a substrate having a projection thereon with a p-type dopant supplied, whereby an island-like p-type semiconductor layer of the group III nitride is grown on a top surface of said projection of said substrate.

9. The method of manufacturing a semiconductor of claim 8, wherein said p-type semiconductor layer has a rectangular or trapezoidal section taken in a direction vertical to the surface of said substrate.

10. A method of manufacturing a semiconductor comprising the steps of:

forming, on a substrate, a semiconductor layer of a group III nitride having a projection thereon; and growing a group III nitride on an entire surface of said semiconductor layer with a p-type dopant supplied, whereby an island-like p-type semiconductor layer of the group III nitride is grown on a top surface of said projection of said semiconductor layer.

11. The method of manufacturing a semiconductor of claim 10, wherein said p-type semiconductor layer has a rectangular or trapezoidal section taken in a direction vertical to a surface of said substrate.

12. A method of manufacturing a semiconductor comprising the steps of:

forming, on a substrate, a mask pattern for selective growth having an opening; and selectively growing a group III nitride on said opening of said mask pattern on said substrate with a p-type dopant supplied, whereby a p-type semiconductor layer of the group III nitride is selectively grown on said opening of said mask pattern on said substrate.

13. The method of manufacturing a semiconductor of claim 12, wherein said mask pattern is formed out of silicon oxide or silicon nitride.

14. The method of manufacturing a semiconductor of claim 12, wherein said p-type semiconductor layer has a rectangular or trapezoidal section taken in a direction vertical to a surface of said substrate.

15. A method of manufacturing a semiconductor device comprising the steps of:

growing, on a substrate having a projection thereon, a cladding layer of a first conductivity type on a top surface of said projection of said substrate;

growing an active layer of $In_xGa_{1-x}N$, wherein $0 \leq x \leq 1$, on said cladding layer of the first conductivity type; and growing a cladding layer of a second conductivity type on said active layer.

16. The method of manufacturing a semiconductor device of claim 15, wherein the second conductivity type is a p-type conductivity, and said method is further provided with a step of growing a group III nitride on said cladding layer of the second conductivity type with a p-type dopant supplied, whereby a p-type contact layer of the group III nitride is formed.

17. A method of manufacturing a semiconductor device comprising the steps of:

forming, on a substrate, a semiconductor layer of a group III nitride having a projection thereon;

growing a first cladding layer of a first conductivity type on a top surface of said projection of said semiconductor layer;

growing an active layer of $In_xGa_{1-x}N$, wherein $0 \leq x \leq 1$, on said cladding layer of the first conductivity type; and growing a cladding layer of a second conductivity type on said active layer.

18. The method of manufacturing a semiconductor device of claim 17, wherein the second conductivity type is a p-type conductivity, and said method is further provided with a step of growing a group III nitride on said cladding layer of the second conductivity type with a p-type dopant supplied, whereby a p-type contact layer of the group III nitride is formed.

19. A method of manufacturing a semiconductor device comprising the steps of:

growing a contact layer of a first conductivity type on a substrate;

forming a mask pattern for selective growth having an opening on said contact layer of the first conductivity type;

selectively growing a cladding layer of the first conductivity type on said opening of said mask pattern on said contact layer of the first conductivity type;

selectively growing an active layer of $In_xGa_{1-x}N$, wherein $0 \leq x \leq 1$, on said cladding layer of the first conductivity type; and selectively growing a cladding layer of a second conductivity type on said active layer.

20. The method of manufacturing a semiconductor device of claim 19, further comprising a step of baring said contact layer of the first conductivity type by removing said mask pattern through wet etching.

21. The method of manufacturing a semiconductor device of claim 19, wherein the second conductivity type is a p-type conductivity, and said method is further provided with a step of growing a group III nitride on said cladding layer of the second conductivity type with a p-type dopant supplied, whereby a p-type contact layer of the group III nitride is formed.

22. A method of manufacturing a semiconductor substrate comprising the steps of:

forming a mask pattern for selective growth having an opening on a first substrate; and growing a semiconductor layer including gallium and nitrogen on and in a periphery of said opening of said mask pattern on said first substrate, whereby a second substrate including said semiconductor layer is formed on said first substrate.

23. A method of manufacturing a semiconductor substrate comprising the steps of:

growing a first semiconductor layer including gallium and nitrogen on an entire surface of a first substrate;

forming a mask pattern for selective growth having an opening on said first semiconductor layer; and growing a second semiconductor layer including gallium and nitrogen on and in a periphery of said opening of said mask pattern on said first semiconductor layer, whereby a second substrate including said second semiconductor layer is formed on said first substrate.

* * * * *